US011404118B1

(12) United States Patent
Sadd et al.

(10) Patent No.: US 11,404,118 B1
(45) Date of Patent: Aug. 2, 2022

(54) MEMORY WITH SENSE AMPLIFIERS

(71) Applicant: NXP USA, INC., Austin, TX (US)

(72) Inventors: Michael A. Sadd, Austin, TX (US); Jon Scott Choy, Austin, TX (US)

(73) Assignee: NXP USA, INC., Austin, TX (US)

(*) Notice: Subject to any disclaimer, the term of this patent is extended or adjusted under 35 U.S.C. 154(b) by 8 days.

(21) Appl. No.: 17/159,820

(22) Filed: Jan. 27, 2021

(51) Int. Cl.
*G11C 7/02* (2006.01)
*G11C 13/00* (2006.01)

(52) U.S. Cl.
CPC .... *G11C 13/004* (2013.01); *G11C 2013/0045* (2013.01); *G11C 2013/0054* (2013.01); *G11C 2213/79* (2013.01)

(58) Field of Classification Search
CPC .......... G11C 13/004; G11C 2013/0054; G11C 2013/0045
USPC ......................................................... 365/207
See application file for complete search history.

(56) References Cited

U.S. PATENT DOCUMENTS

| | | |
|---|---|---|
| 6,693,826 B1 | 2/2004 | Black, Jr. et al. |
| 7,292,484 B1 | 11/2007 | Andre et al. |
| 9,378,781 B1 | 6/2016 | Jung et al. |
| 9,601,165 B1 * | 3/2017 | Dray ................. G11C 11/1675 |
| 9,741,417 B1 | 8/2017 | Sadd et al. |
| 2014/0056054 A1 * | 2/2014 | Kim ................... G11C 13/0002 365/148 |
| 2014/0153313 A1 | 6/2014 | Boujamaa et al. |

OTHER PUBLICATIONS

Boujamaa, E., "A 14.7Mb/mm2 28nm FDSOI STT-MRAM with Current Starved Read Path, 529/Sigma Offset Voltage Sense Amplifier and Fully Trimmable CTAT Reference", 2020 IEEE Symposium on VLSI Circuits, Jun. 16-19, 2020.
De Brosse, J., "A Fully-Functional 90nm 8mb STT-MRAM Demonstrator Featuring Trimmed, Reference Cell-Based Sensing", 2015 IEEE Custom Integrated Conference (CICC), Sep. 28-30, 2015.
Kim, C., "A Covalent-Bonded Cross-Coupled Current-mode sense amplifier for STT-MRAM with 1T1MTJ common source-line structure array", 2015 IEEE International Solid-State Circuits Conference—(ISSCC) Digest of Technical Papers, Feb. 22-26, 2015.

* cited by examiner

*Primary Examiner* — Vu A Le
(74) *Attorney, Agent, or Firm* — David G. Dolezal

(57) ABSTRACT

A memory includes a pair of sense amplifiers where the pair of sense amplifiers perform a multiphase memory operation to read data from two memory cells. Each sense amplifier includes two current paths. During a first phase of the memory read operation, one of the two sense amplifiers provides current through both a first memory cell and a first reference cell and the other sense amplifier of the two provides current through both a second memory cell and a second reference cell. The reference cells each have different resistance values. During a second phase of the memory read operation, one of the sense amplifiers provides current through both of the first memory cell and the second reference cell and the second sense amplifier provides current through the second memory cell and the first reference cell.

20 Claims, 6 Drawing Sheets

MEMORY WITH SENSE AMPLIFIERS

BACKGROUND OF THE INVENTION

Field of the Invention

This invention relates in general to a memory and more specifically to a memory with sense amplifiers.

Description of the Related Art

Some memories utilize sense amplifiers for reading the storage states of memory cells of the memory. Some sense amplifiers include a reference path that includes a reference cell and a sense path that is coupled to the cell being read during a memory read operation.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In one embodiment, a memory includes a pair of sense amplifiers where the pair of sense amplifiers perform a multiphase memory operation to read data from two memory cells. Each sense amplifier includes two current paths. During a first phase of the memory read operation, one of the two sense amplifiers provides current through both a first memory cell and a first reference cell and the other sense amplifier of the two provides current through both a second memory cell and a second reference cell. The reference cells each have different resistance values. During a second phase of the memory read operation, one of the sense amplifiers provides current through both of the first memory cell and the second reference cell and the second sense amplifier provides current through the second memory cell and the first reference cell.

In one embodiment, providing a memory with a pair of sense amplifiers to perform multiphase memory read operations where a different reference cell (or different memory cell) is provided current by a different sense amplifier during each read, may in some embodiments, provide for a memory where the reference cell configurations can be simplified. With some of the embodiments described herein, the two reference cells may have different resistance values that are "effectively averaged" by the multiphase memory operation to effectively provide a resistance value between the two resistance values of the two resistance cells, which provides for a more accurate resistance. Accordingly, a more accurate resistance can be achieved using less reference devices per memory in that the two different reference cells with two different resistance values are each used by two sense amplifiers during the difference phases.

With some types of memory cells such as resistive memory cells (e.g. MRAM), the resistance margin between a memory cell being read and a reference cell may be less than 1K ohm. Furthermore, with some embodiments, to avoid disturbing the memory cell during a memory read operation, the current should be limited e.g. in the range of 10-20 micro amps. Translating this current to the difference in voltage drops across the resistive memory cell and reference cell means that in some embodiments, a sense amplifier circuit must distinguish differences in the voltages of less than 10-20 mV, which can be in the range of device mismatch of some transistors of the sense amplifier.

Figure 1:
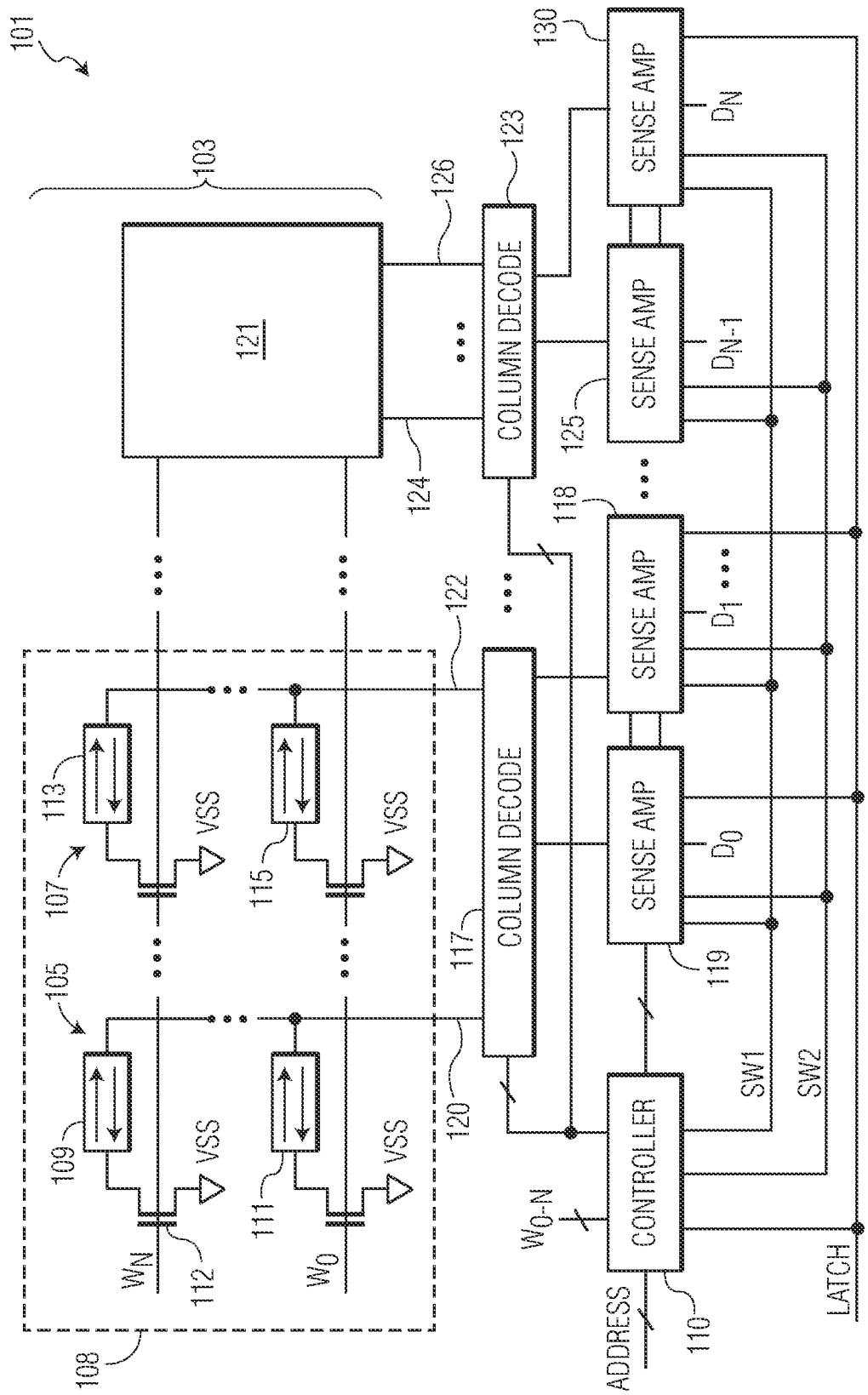
FIG. 1 is a circuit diagram of a memory according to one embodiment of the present invention.

FIG. 1 is a circuit diagram of a memory according to one embodiment of the present invention. Memory 101 includes a memory array 103. In the embodiment shown, memory array 103 includes two array segments, segment 108 and segment 121. In the embodiment shown, memory segment 108 includes resistive memory cells (e.g. 109, 113, 111, and 115) located in rows and columns. The memory cells of segment 121 are not shown in FIG. 1. Each segment includes a number of cells that are individually accessible by asserting a specific word line (W0 . . . WN) and by selecting the appropriate columns (105, 107) by column decode circuitry 117 and 123. The word lines are each connected to an access transistor (112) of a cell of a column (105, 107) that are made conductive when a word line is asserted.

In the embodiment shown, one portion of the cells of array segment 108 can be read by sense amplifier 119 and the other portion can be read by sense amplifier 118. One portion of the cells of array segment 121 (cells not specifically shown) can be read by sense amplifier 125 and the other portion can be read by sense amplifier 130. The portions of the cells of each segment readable by the different sense amplifiers are located in different columns of a segment. For example, the cells of column 105 are read by sense amplifier 119 and the cells of column 107 are read by sense amplifier 118. Sense amplifiers 119, 118, 125, and 130 each produce a data bit (D0, D1, DN−1, and DN, respectively) that is indicative of the storage state of the memory cell being read during a read operation. The specific cells of the segment being read are determined by an address provided to controller 110 on the ADDRESS lines of a bus received from a processor (not shown). Controller 110 asserts the appropriate word line and selects the appropriate columns via the column decode circuitry (117, 123) to couple the cells being read to the sense amplifier (119, 118, 125, 130).

In some embodiments, the memory cells (109, 113, 111, and 115) of array 103 are resistive memory cells. In one embodiment, the cells are MRAM cells, but may be of other types of resistive memory cells in other embodiments such as ReRAM cells, carbon nanotube cells, phase change cells, cross point cells, or programmable metallization fuse cells.

A resistive memory cell is a memory cell capable of having different resistance values with each resistance value is indicative of a storage state of the memory cell. In other embodiments, array 103 may include other types of memory cells. In one embodiment, the memory cells have two storage states. With one storage state, the memory cell has a high resistance value, and with the other storage state, the memory cell has a low resistance value. In one embodiment, the memory cells of array 103 are non-volatile in that they retain their memory state without being powered by a power source. However, the cells may be volatile memory cells in other embodiments.

Although the memory circuit in FIG. 1 shows two rows, two array segments (108, 121), two columns per array segment, and four sense amplifiers (119, 118, 125 and 130), other memory circuits may include a different number of rows, array segments, columns per array segment, and/or sense amplifier circuits. For example, each segment (108) may include 64 columns where 32 columns are accessible by one sense amplifier (119) and the other 32 columns are accessible by the other sense amplifier (118).

In other embodiments, memory 101 may have other configurations and/or include other circuitry. For example, memory 101 may include write circuitry (not shown) for writing values to the cells of array 103. Also, although only one column line (120, 122) per column (105, 107) is shown in FIG. 1, other memories may include more than one column line (e.g. a source line and a bit line) per column. In some embodiments, the extra column lines are utilized in writing data to the memory cells. The memory cells may have other configurations in other embodiments. Memory 101 may be implemented in a standalone integrated circuit or may be integrated with other circuitry (e.g. a processor, peripherals) in an integrated circuit.

Figure 2:
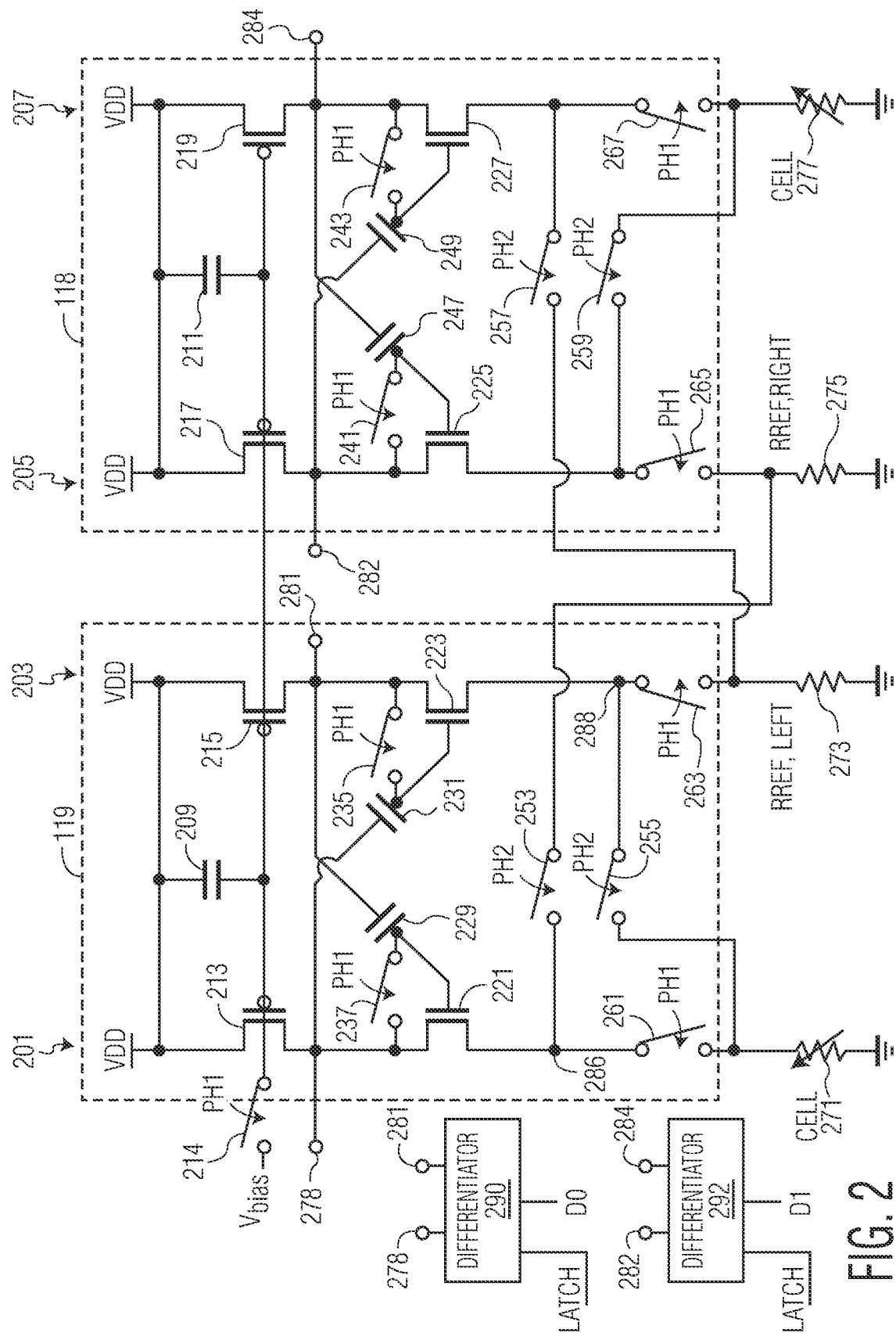
FIG. 2 is a circuit diagram of sense amplifiers according to one embodiment of the present invention.

FIG. 2 is a circuit diagram of one embodiment of two sense amplifiers (e.g. sense amplifiers 118 and 119) of memory 101 that share reference cells (273, 275) during a multiphase memory operation. Other sense amplifier pairs (125, 130) of memory 101 may have a similar design. In one embodiment, cell 271 represents a memory cell in one set of columns of segment 108 that is read during a memory read operation by sense amplifier 119 and cell 277 represents a memory cell of another set of columns of segment 108 that is read by sense amplifier 118 during a memory ready operation. In one embodiment, cell 271 is coupled to sense amplifier 119 and cell 277 is coupled to sense amplifier 118 by asserting the appropriate word line and column lines (through column decode circuitry 117) (not shown in FIG. 2). Cells 271 and 277 are coupled to supply voltage VSS (system ground in some embodiments) by an access transistor (e.g. 112) (not shown in FIG. 2) being made conductive by an asserted word line.

In the embodiment shown, sense amplifiers 118 and 119 use reference cells 273 and 275 in reading the storage states of the memory cells during a memory read operation. In one embodiment, the reference cells are located in the same area of an integrated circuit as the array segments of the memory cells being read and are of the same type of devices as the memory cells. In other embodiments, reference cell 273 is located in sense amplifier 119 and reference cell 275 is located in sense amplifier 118. In still other embodiments, the reference cells would be located in a separate circuit.

In one embodiments, reference cell 273 has a resistance that is equal to a typical resistance of memory cell of array 103 having a high resistance state (HRS) resistance value and reference cell 275 has a resistance that is equal to a typical resistance of a memory cell of array 103 having a low resistance state (LRS) resistance value. In other embodiments, reference cell 273 may have the low resistance state resistance and cell 275 may have the high resistance state resistance. In some embodiments, the typical resistance value of a memory cell in the low resistance state (LRS) may be in the range of 1-5K ohms, and the typical resistance value of a memory cell in the high resistance state (HRS) may be in the range of 2-10K ohms. However, other embodiments may utilize other resistance values. In one embodiment, the high resistance state of memory cell is 400 ohms higher than the low resistance state of a memory cell.

In some embodiments, reference cell 273 is physically located with devices of sense amplifier 119 devices and reference cell 275 is physically located with the devices of sense amplifier 118. The resistances between the memory cells of array 103 (including the decoder circuitry and access transistors) and the sense amplifiers 118 and 119 are reflected in the resistance values of the reference cells 273 and 275.

In some embodiments, a reference cell may include one or more resistive elements. For example, one of the reference cells (e.g. 273) may include a cell of array 103 that is written to a high resistance value and the other of the reference cells (e.g. 275) may include a cell of array 103 written to a low resistance value. In other embodiments, the reference cells may include resistors that are sized to provide the appropriate values.

In some embodiments, different reference cells may be used during different memory read operations depending upon which memory cell is being read. In one embodiment, other devices (e.g. switches) may be located between the sense amplifiers 118 and 119 and the reference cells 273 and 275.

In the embodiment shown, sense amplifiers 118 and 119 read data from memory cells in a two-phase memory read operation. In FIG. 2, the switches are identified with the phases of a memory read operation in which they are closed. For example, switches 214, 237, 235, 241, 243, 261, 263, 265 and 267 are identified with "PH1" indicating that they are only closed during Phase 1 of a memory read operation (and open during Phase 2 of a memory read operation). Switches 253, 255, 257, and 259 are identified with a "PH2" indicating that they are only closed during Phase 2 of a memory read operation (and open during Phase 1 of a memory read operation). In one embodiment, Phase 1 is characterized as a pre-charge phase and Phase 2 is characterized as a sense phase of a memory read operation.

Sense amplifier 119 includes current path 201 and current path 203. Current path 201 includes P-channel transistor 213, and N-channel transistor 221 whose drain is connected to the drain of transistor 213 at node 278. Current path 203 includes P-channel transistor 215, and N-channel transistor 223 whose drain is connected to the drain of transistor 215 at node 281. Node 286 is connected to switches 261 and 253 that allow path 201 to be coupled to a memory cell (cell 271 in FIG. 2) or reference cell 275, respectively. Node 288 is connected to switches 255 and 263 that allow path 203 to be coupled to a memory cell (cell 271 in FIG. 2) or reference cell 273. Not shown in FIG. 2 are the column decode circuitry, access transistors, or other selection switches for coupling the cells of array 103 to sense amplifier 119. In one embodiment, switches 253, 255, 261, and 263 are located in sense amplifier 119. However, in other embodiments, at least some of these switches may be located in other circuitry (e.g. decoder circuitry 117).

In the embodiment shown, sense amplifier 119 includes a capacitor 209 having an electrode coupled to a supply voltage VDD (e.g. 1 volt) and another electrode connected to the gates of transistors 213 and 215. The gates of transistors 213 and 215 are coupled to switch 214 which is coupled to a VBIAS voltage source that is set such that transistors 213 and 215 mirror a set current, typically in the range 5-20 µA. Switch 214 is closed during Phase 1 of a read operation to charge capacitor 209 and bias the gates of transistors 213 and 215 to the VBIAS voltage.

Sense amplifier 119 includes a capacitor 229 having an electrode connected to the gate of transistor 221 and switch 237 and another electrode connected to node 281. Switch 237 is connected to node 278. Capacitor 231 has an electrode connected to the gate of transistor 223 and switch 235 and another electrode connected to node 278. Switch 235 is connected to node 281. During a first phase of a memory read operation, capacitors 229 and 231 store a voltage differential between node 278 and node 281. During the second phase, that sampled voltage differential is applied to the gate of transistor 221 with respect to the voltage of node 281 by capacitor 229 and applied to the gate of transistor 223 with respect to the voltage of node 278 by capacitor 231 to further adjust the conductivity of transistors 221 and 223 versus each other during a second phase of a read operation. The adjustment between the gate voltages by the voltage differentials stored on capacitors 229 and 231 further act to increase the speed at which nodes 278 and 281 move from their values in Phase 1 of a memory read operation to their values in Phase 2 of a memory read operation to reflect the storage state of the memory cell being read (e.g. 271).

Sense amplifier 119 includes switches 261 and 263 that are closed during Phase 1 to couple a memory cell (cell 271) to current path 201 and reference cell 273 to path 203 respectively during Phase 1 of a memory read operation. Switches 253 and 255 are closed during Phase 2 to couple current path 201 to reference cell 275 and couple current path 203 to a memory cell (cell 271), respectively during Phase 2 of a memory read operation.

Sense amplifier 118 includes similar circuitry to sense amplifier 119 and operates in a similar way for current path 205 to provide current through reference cell 275 and current path 207 to provide current to a memory cell (e.g. cell 277), respectively, during Phase 1 of a memory read operation and for current path 205 to provide current through memory cell 277 and for path 207 to provide current through reference cell 273 during Phase 2 of a memory read operation.

Sense amplifier 119 includes a latched differentiator 290 and sense amplifier 118 includes a latched differentiator 292 for providing data read values D0 and D1, respectively, at a specific time during Phase 2 of a read cycle as indicated by the LATCH signal. The output D0 is based on a comparison of the voltages of nodes 278 and 281 and output D1 is based on a comparison of the voltages of nodes 282 and 284 during Phase 2 of the read cycle.

In one embodiment, capacitors 209 and 211 are each implemented with a P-channel transistor whose source, drain, and body are connected to VDD and whose gate is connected to switch 214. Capacitors 229, 231, 247, and 249 are each implemented with a metal to metal "fringe" capacitor or FMOM. However, these capacitors may be implemented by other types of capacitors in other embodiments.

In one embodiment, the switches (e.g. 214, 237, 235, 253, 255, 261, 263, 241, 243, 257, 259, 265, and 267) shown in FIG. 2 are implemented by transistors (e.g. N-channel transistors). In other embodiments, the switches may be implemented with other types of switching devices (e.g. pass gates, P-channel transistors, other types of transistors).

Sense amplifiers 118 and 119 may have other configurations, include other devices, and/or operate in a different manner in other embodiments.

Figure 3:
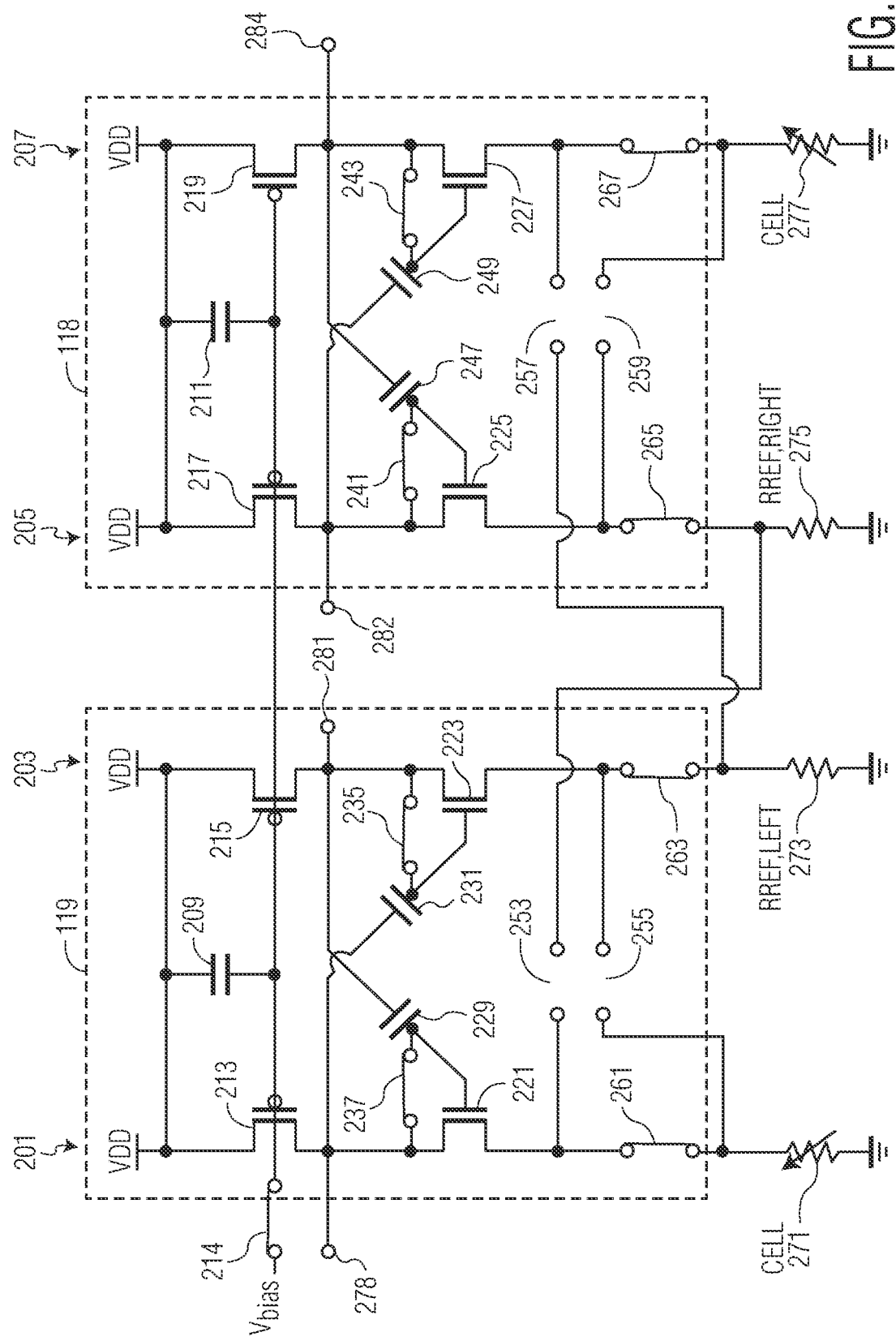
FIG. 3 is a circuit diagram of portions of the sense amplifiers of FIG. 2 showing a phase of a memory read operation according to one embodiment of the present invention.

FIG. 3 shows a circuit diagram of portions of sense amplifiers 118 and 119 during Phase 1 of a memory read operation. During phase 1, switches 214, 237, 235, 261, 263, 241, 243, 265, and 267 are closed and switches 253, 255, 257, and 259 are open.

During Phase 1, transistors 213, 215, 217 and 219 are biased the VBIAS voltage to provide a constant current through paths 201, 203, 205, and 207. Transistors 221, 223, 225, and 227 are in a diode configuration with switches 237, 235, 241, and 243 closed, wherein the VDS voltage drop across transistors 221, 223, 225, and 227 is a diode voltage drop. Switch 261 is closed for path 201 to provide current through cell 271. Switch 263 is closed for path 203 to provide current through reference cell 273. Switch 265 is closed for path 205 to provide current through reference cell 275. Switch 267 is closed for path 207 to provide current through reference cell 277.

As a result of Phase 1, the voltage at node 278 equals the current produced by transistor 213 times the resistance of cell 271 plus the diode drop of transistor 221. The voltage at node 281 equals the current produced by transistor 215 times the resistance of reference cell 273 plus the diode drop of transistor 223. The voltage at node 282 equals the current produced by transistor 217 times the resistance of reference cell 275 plus the diode drop of transistor 225. The voltage at node 284 equals the current produced by transistor 219 times the resistance of memory cell 277 plus the diode drop of transistor 227.

Regarding sense amplifier 119, if cell 271 has a higher resistance than reference cell 273, then the voltage at node 278 will be higher than the voltage at node 281 during Phase 1. If cell 271 has a lower resistance than reference cell 273, then node 278 will have a lower voltage than node 281. If the resistances of the cells are the same, the voltages of nodes 278 and 281 will be approximately the same as well.

During Phase 1, the difference in voltages between nodes 278 and 281 is sampled by capacitors 229 and 231. In a similar way, capacitors 247 and 249 sample the voltage difference between nodes 282 and 284.

Figure 4:
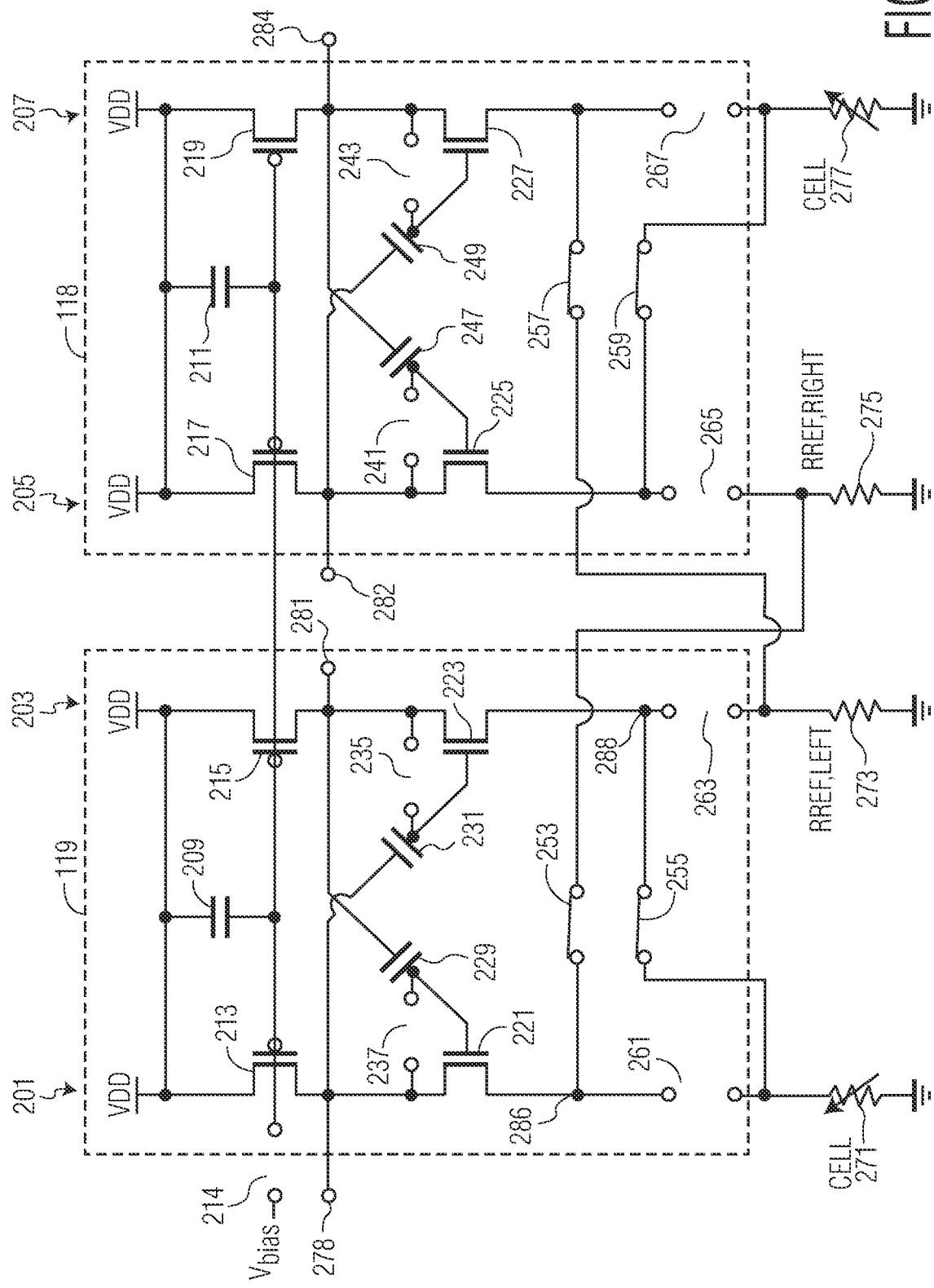
FIG. 4 is a circuit diagram of portions of the sense amplifiers of FIG. 2 showing another phase of a memory read operation according to one embodiment of the present invention.

FIG. 4 shows a circuit diagram of sense amplifiers 119 and 118 during Phase 2 of a memory read operation. During Phase 2, switches 253, 255, 257, and 259 are closed and the other switches 214, 237, 235, 261, 263, 241, 243, 265, and 267 are open.

With switch 214 open during Phase 2, the gates of transistors 213, 215, 217, and 219 continue to be biased by the sampled voltage stored on capacitors 209 and 211 to maintain the same current provided by current source transistors 213, 215, 217, and 219 during Phase 1. Isolating the gates of transistors 213, 215, 217, and 219 from the VBIAS voltage source and biasing the gates with capacitors 209 and 211 in some embodiments, minimizes the effect of kickback noise on current paths 201, 203, 205, and 207 due to the other sense amplifier circuits of memory 101 whose current source transistors (e.g. 221, 223, 225, and 227) are also biased by the VBIAS voltage source while it sets the current flowing through those transistors in the diode connected configuration. In some embodiments, switch 214 may be open during Phase 1 if there is enough time between read operations (during which time switch 214 is closed) to charge capacitors 209 and 211 to the VBIAS voltage.

During Phase 2, switch 253 is closed for path 201 to provide current through reference cell 275, switch 255 is closed for path 203 to provide current through cell 271, switch 259 is closed for path 205 to provide current through memory cell 277, and switch 257 is closed for path 207 to provide current though reference cell 273.

During Phase 2, because switches 237, 235, 241, and 243 are open, transistors 221, 223, 225, and 227 are no longer in diode configuration. Thus, the conductivity of these transistors is controlled by the voltage at their gates. Because switches 237, 235, 241, and 243 are opened in Phase 2, capacitors 229, 231, 247, and 249 act as floating batteries with a voltages sampled in Phase 1 either adding (or subtracting depending on the polarity) from the voltages of nodes 281, 278, 284, and 282, respectively.

For example, assuming that the voltage of node 278 was ½ volts higher than the voltage of node 281 at the end of Phase 1, the electrode of capacitor 231 connected to node 278 would be ½ volts higher than the electrode of capacitor 231 connected to the gate of transistor 223. Also, at the end of Phase 1, the electrode of capacitor 229 connected to node 281 would be ½ volts lower than the electrode of capacitor 229 connected to the gate of transistor 221.

For this example, at the beginning of Phase 2, the gate of transistor 223 would be ½ volts lower than the voltage of node 278 and the gate of transistor 221 would be ½ volts higher than the voltage of node 281 due to capacitors 229 and 231 acting as floating batteries. Accordingly, transistor 221 is made more conductive by the sampled voltage on capacitor 229 than it would be if the voltage of node 281 were applied directly to the gate of transistor 221, and transistor 223 is made less conductive by the sampled voltage on capacitor 231 than it would be if the voltage of node 278 were applied directly to the gate of transistor 223 in this example. Increasing the conductivity of transistor 221 acts to reduce the resistance of transistor 221 and increases the current sinking ability of transistor 221 which pulls down the voltage of node 278 faster. Decreasing the conductivity of transistor 223 acts to increase the resistance of transistor 223 and decreases the current sinking ability of transistor 223 which pulls down the voltage of node 281 slower.

In the case where memory cell 271 is in the high resistance state, in Phase 2, current path 203 provides current to the high resistance state memory cell 271 through closed switch 255 and path 201 provides current to reference cell 275 through closed switch 253. In one embodiment, since reference cell 273 is at a low reference state, reference cell 275 will be at the high resistance state. Accordingly, the resistances of memory cell 271 and reference cell 275 will be about the same. Therefore node 278 starts Phase 2 at a similar voltage as at the end of Phase 1. At the start of Phase 2 the current through path 203 now passes through the high resistance state memory cell 271 instead of the low resistance state reference cell 273, therefore node 288 increases in voltage, as does node 281. Because transistor 221 is made more conductive by the sampled voltage on capacitor 229 and by the increase in voltage on node 281, and because transistor 223 is made less conductive by sampled voltage on capacitor 231, transistor 221 will sink more current than transistor 223 and will pull node 278 lower than node 281. Node 278 being pulled lower makes transistor 223 even less conductive and more resistive where the voltage of node 281 is pulled higher. Node 278 being at a low voltage and node 281 being at a complementary high voltage causes differentiator 290 to output at D0 a high voltage value indicating that a cell 271 is at a high resistance state. In one embodiment, sampling the voltage on capacitors 229 and 231 during Phase 1 ensures that the voltage at node 281 increases relative to node 278 even when transistors 221 and 223 do not have identical threshold voltages.

If on the other hand, memory cell 271 were at a low resistance state, reference cell 273 were at a high resistance state, and reference cell 275 were at a low resistance state, then during Phase 1, node 278 would be pulled to a lower voltage and node 281 would be pulled to a higher voltage. For this condition in Phase 2, capacitor 231 with the sampled voltage differential would increase the voltage at the gate of transistor 223 during Phase 2 to make transistor 223 more conductive than if the gate of transistor 223 where connected to node 278 and capacitor 229 with the sampled voltage differential would decrease the voltage at the gate of transistor 221 to make transistor 221 less conductive than if the gate of transistor 221 where connected to node 281. At the start of Phase 2 the current through path 203 now passes through the low resistance state memory cell 271 instead of the high resistance state reference cell 273, therefore node 281 decreases in voltage and transistor 221 becomes less conductive. With voltage of node 281 decreasing as well as the sampled voltages stored on capacitors 229 and 231, transistor 223 will sink more current than transistor 221 during Phase 2. Accordingly, during Phase 2, because of the difference in conductivity of transistors 221 and 223, node 281 is pulled to a low voltage and node 278 is pulled to a higher voltage. In such a condition, differentiator 290 will indicate at output D0 that memory cell 271 is at a low resistance state.

As described in the two examples above, the memory cell being read (271) was at an opposite resistance state than reference cell 273. Accordingly, during Phase 1, the voltage differentials where sampled on capacitors 229 and 231 to change the conductivity of transistors 221 and 223 with respect to each other during Phase 2. Thus, even though memory cell 271 and reference cell 275 have the same resistance value, the difference in conductivity of transistors 221 and 223 during Phase 2 causes the voltages of nodes 278 and 281 to pull to complementary voltage levels.

During a case where a sense amplifier's current paths are coupled to a memory cell and a reference cell having the same resistance state during Phase 1, negligible voltages would be stored on capacitors 229 and 231 during Phase 1. However, during Phase 2, when reference cell 275 which has an opposite resistance value with respect to memory cell 271 is coupled to path 201, the difference between resistance values of memory cell 271 and reference cell 275 would cause nodes 278 and 281 to provide complementary voltage values indicating the resistance storage state of memory cell 271.

Accordingly, in cases where the reference cells 273 and 275 have difference resistance states and each reference cell is used during one of the phases of a memory read operation, a sense amplifier will provide a proper indication of the value being stored in the memory cell regardless whether the sense amplifier is coupled to the reference cell matching the resistance of the memory cell during Phase 1 or during Phase 2.

Accordingly, in such embodiments, a memory is able to use reference cells that are either in the high resistance state or in the low resistance state. With these embodiments, the memory does not have to include multiple reference cell devices per sense amplifier to provide for an average reference resistance in that a sense amplifier shares two reference cells of different resistance levels with another sense amplifier, where the two phase memory read operation effectively averages the resistances of the two reference cells. Thus, in these embodiments, a memory can be implemented with less reference devices per sense amplifier. For example, the reference cells may be programed memory cells in a different column of array 103, where half the reference cells would be programmed as at high resistance state and the other half programmed at a low resistance state.

Figure 5:
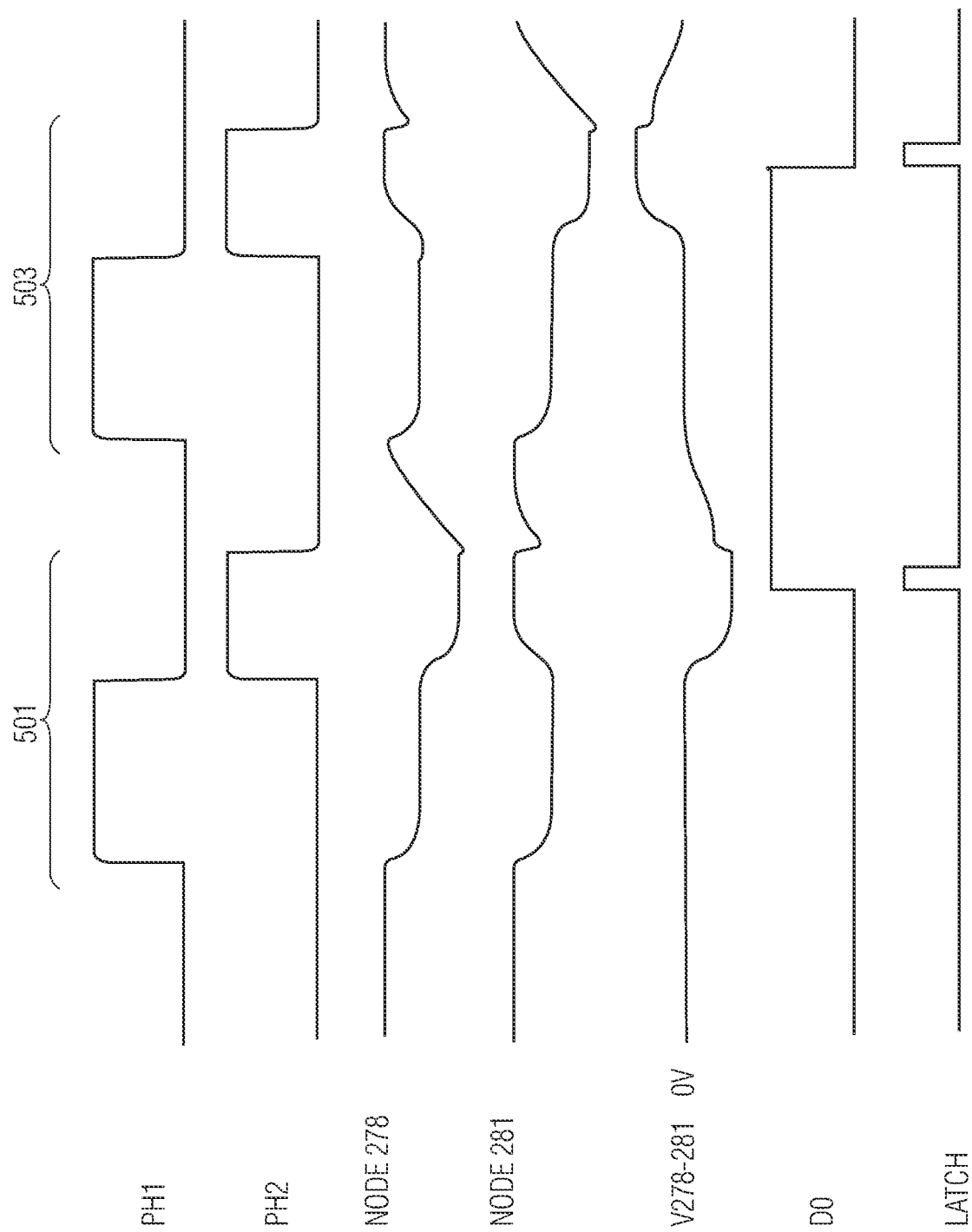
FIG. 5 is a timing diagram of a read operation of a memory cell according to one embodiment of the present invention.

FIG. 5 is a timing showing the operation of sense amplifier 119 during two consecutive memory read operations 501 and 503. In the embodiment shown, the memory read operations are two phase memory read operations where Phase 1 occurs when signal PH1 is high and Phase 2 occurs when signal PH2 is high.

Prior to a memory read operation, the voltages of nodes 278 and 281 are equalized at an intermediate voltage level related to a diode configuration. During Phase 1, the voltages of nodes 278 and 281 settle at a level where the voltage difference is sampled by capacitors 229 and 231. During phase 2, the voltage of nodes 278 and 281 are pulled to complementary values. Line "V278-V281" represents the difference between the voltage of node 278 versus the voltage of node 281. During Phase 2 of read operation 501, the voltage of node 281 is higher than the voltage of node 278 indicating that a "1" value is stored in the memory cell being read. At the occurrence of the LATCH pulse during Phase 2, differentiator 290 asserts a high voltage value at its output D0 to indicate that a "1" is being stored in the memory cell being read.

After memory read operation 501, the voltages of nodes 278 and 281 are restored to their intermediate voltage levels. During Phase 2 of memory read operation 503, the voltage of node 278 is pulled to a high voltage value and the voltage of node 281 is pulled low voltage value where differentiator 290 asserts its D0 output at a "0" value in response to the second LATCH pulse of FIG. 5. After Phase 2 of read operation 503, the voltages return to their previous read voltage level.

Figure 6:
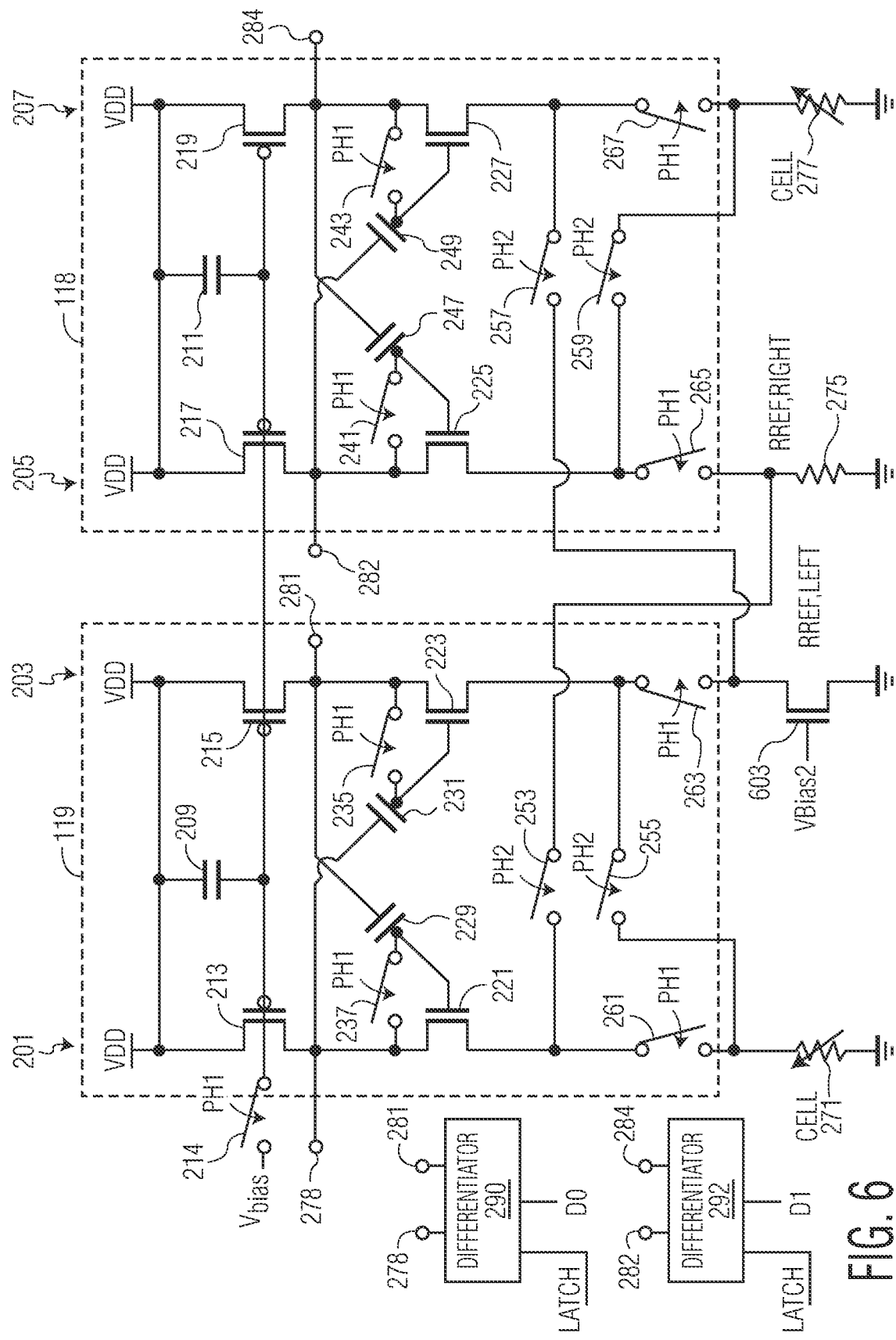
FIG. 6 is a circuit diagram of sense amplifiers according to another embodiment of the presentation invention.

FIG. 6 is a circuit diagram of sense amplifiers 118 and 119 according to another embodiment of the present invention. Sense amplifiers 118 and 119 of FIG. 6 are similar to sense amplifiers 118 and 119 of FIG. 2 with the devices having similar numbers being the same. In FIG. 6, the resistive reference cell 273 of FIG. 2 is implemented with a NFET transistor 603 that is biased at a VBIAS2 voltage to set the resistance across transistor 603 at a desired resistance value. In other embodiments, reference cell 275 could also be implemented with a transistor biased at a particular voltage.

In other embodiments, sense amplifiers 118 and 119 can be used to read complimentary memory cells where the complimentary memory cells are programed at complementary storage states to store a data value. For example, with resistive complementary memory cells, a first complementary memory cell of a pair of complementary memory cells would be programmed to have a high resistance state and the second complementary cell of the pair would be programmed to have a low resistance state in order to store a specific data value (e.g. a "1" or "0"). To store the opposite data value, the first complementary memory cell would be programmed to have a low resistance state and the second complementary memory cell would be programmed to have a high resistance state. In the embodiments of the Figures, cells 109 and 113 could be combined to create a complementary memory cells, each programmed with the opposite resistance state to store a data value.

Although the sense amplifier circuits shown are implemented with MOSFETS, a sense amplifier circuit can be implemented with other devices, e.g. bipolar transistors, in other embodiments. In addition, some embodiments of a memory read operation may include an additional phase in addition to Phase 1 and Phase 2. Also, features described herein with respect to one embodiment, may be implemented in other embodiments described herein. A gate is a control terminal for a field effect transistor and source and drains are control terminals for field effect transistors.

In the embodiments of FIGS. 2 and 6, each sense amplifier 118 and 119 provides current to the same memory cell during both phases of a read operation and to a different reference cell during each of the two phases of a read operation. For example, sense amplifier 119 provides current to cell 271 during both Phase 1 and Phase 2 and provides current to reference cell 273 during Phase 1 and reference cell 275 during Phase 2. However, in other embodiments, a sense amplifier would provide current to a single reference cell during both Phase 1 and Phase 2 and to different memory cells during Phase 1 and Phase 2. For example, referring to FIG. 2, the switches of sense amplifier 119 could be arranged such that sense amplifier 119 provides current to reference cell 273 for both Phase 1 and Phase 2 and provides current to memory cell 271 during Phase 1 and memory cell 277 during Phase 2.

In one embodiment, a memory includes a first plurality of memory cells, a second plurality of memory cells, a first reference cell, and a second reference cell. The second reference cell has a resistance value that is different from a resistance value of the first reference cell. The memory includes a first sense amplifier and a second sense amplifier. During a first phase of a memory read operation for reading a memory cell of the first plurality of memory cells and a memory cell of the second plurality of memory cells and before a second phase of the memory read operation, one of the first sense amplifier and the second sense amplifier provides current through both the memory cell of the first plurality and the first reference cell and the other of the first sense amplifier and the second sense amplifier provides current through both the memory cell of the second plurality and the second reference cell. During the second phase of the memory read operation, one of the first sense amplifier and the second sense amplifier provides current through both the memory cell of the first plurality and the second reference cell and the other of the first sense amplifier and the second sense amplifier provides current through both the memory cell of the second plurality and the first reference cell.

In another embodiment, a memory includes a first plurality of memory cells, a second plurality of memory cells, a first reference cell, a second reference cell, and a first sense amplifier. The first sense amplifier includes a first current path for providing current through a memory cell during a first phase of a memory read operation and through a reference cell during a second phase of a memory read operation, a second current path for providing current through a reference cell during a first phase of a memory read operation and through a memory cell during a second phase of a memory read operation, a first capacitor that is coupled to the first current path and coupled through a first switch to the second current path, and a second capacitor that is coupled to the second current path and coupled through a second switch to the first current path. The memory includes a second sense amplifier. The second sense amplifier includes a third current path for providing current through a memory cell during a first phase of a memory read operation and through a reference cell during a second phase of a memory read operation, a fourth current path for providing current through a reference cell during a first phase of a memory read operation and through a memory cell during a second phase of a memory read operation, a third capacitor that is coupled to the third current path and coupled through a third switch to the fourth current path, and a fourth capacitor that is coupled to the fourth current path and coupled through a fourth switch to the third current path. During a first phase of a memory read operation for reading a memory cell of the first plurality of memory cells and a memory cell of the second plurality of memory cells and before a second phase of the memory read operation, one of the first sense amplifier and the second sense amplifier provides current through both the memory cell of the first plurality and the first reference cell and the other of the first sense amplifier and the second sense amplifier provides current through both the memory cell of the second plurality and the second reference cell. During the second phase of the memory read operation, one of the first sense amplifier and the second sense amplifier provides current through both the memory cell of the first plurality and the second reference cell and the other of the first sense amplifier and the second sense amplifier provides current through both the memory cell of the second plurality and the first reference cell.

In another embodiment, a method of performing a memory read operation includes performing a first phase of a memory read operation for reading a memory cell of a first plurality of memory cells and a memory cell of the second plurality of memory cells. During the first phase, one of a first sense amplifier and a second sense amplifier provides current through both the memory cell of the first plurality and a first reference cell and the other of the first sense amplifier and the second sense amplifier provides current through both the memory cell of the second plurality and a second reference cell, the first reference cell includes a reference resistance that is different than a reference resistance provided by the second reference cell. The method includes performing a second phase of the memory read operation, wherein during the second phase, one of the first sense amplifier and the second sense amplifier provides current through both the memory cell of the first plurality and the second reference cell and the other of the first sense amplifier and the second sense amplifier provides current through both the memory cell of the second plurality and the first reference cell.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory comprising:
a first plurality of memory cells;
a second plurality of memory cells;
a first reference cell;
a second reference cell, the second reference cell having a resistance value that is different from a resistance value of the first reference cell;
a first sense amplifier;
a second sense amplifier;
wherein during a first phase of a memory read operation for reading a memory cell of the first plurality of memory cells and a memory cell of the second plurality of memory cells and before a second phase of the memory read operation, one of the first sense amplifier and the second sense amplifier provides current through both the memory cell of the first plurality and the first reference cell and the other of the first sense amplifier and the second sense amplifier provides current through both the memory cell of the second plurality and the second reference cell;
wherein during the second phase of the memory read operation, one of the first sense amplifier and the second sense amplifier provides current through both the memory cell of the first plurality and the second reference cell and the other of the first sense amplifier and the second sense amplifier provides current through both the memory cell of the second plurality and the first reference cell.

2. The memory of claim 1 wherein:
the first sense amplifier includes a first current path for providing current through a memory cell during a first phase of a memory read operation and through a reference cell during a second phase of a memory read operation;
the first sense amplifier includes a second current path for providing current through a reference cell during a first phase of a memory read operation and through a memory cell during a second phase of a memory read operation;
the second sense amplifier includes a third current path for providing current through a memory cell during a first phase of a memory read operation and through a reference cell during a second phase of a memory read operation;
the second sense amplifier includes a fourth current path for providing current through a reference cell during a first phase of a memory read operation and through a memory cell during a second phase of a memory read operation.

3. The memory of claim 2, wherein:
the first sense amplifier including a first capacitor that is coupled to the first current path and coupled through a first switch to the second current path;
the first sense amplifier including a second capacitor that is coupled to the second current path and coupled through a second switch to the first current path;
the second sense amplifier including a third capacitor that is coupled to the third current path and coupled through a third switch to the fourth current path;
the second sense amplifier including a fourth capacitor that is coupled to the fourth current path and coupled through a fourth switch to the third current path.

4. The memory of claim 3 wherein the first switch, the second switch, the third switch and the fourth switch are closed during the first phase of a memory read operation and open during a second phase of a memory read operation.

5. The memory of claim 3 wherein:
the first current path includes a first transistor for conveying current though the first current path, a control terminal of the first transistor is coupled to the second capacitor;
the second current path includes a second transistor for conveying current though the second current path, a control terminal of the second transistor is coupled to the first capacitor;
the third current path includes a third transistor for conveying current though the third current path, a control terminal of the third transistor is coupled to the fourth capacitor;
the fourth current path includes a fourth transistor for conveying current though the fourth current path, a control terminal of the fourth transistor is coupled to the third capacitor.

6. The memory of claim 1 wherein the first reference cell has a resistance indicative of a first memory cell value state of the first plurality of memory cells and the second plurality of memory cells and the second reference cell has a resistance that indicative of a second memory cell value state of the first plurality of memory cells and the second plurality of memory cells that is different from the first memory cell value state.

7. The memory of claim 1 wherein:
during the first phase of the memory read operation, the first sense amplifier provides current through both the memory cell of the first plurality and the first reference cell and the second sense amplifier provides current through both the memory cell of the second plurality and the second reference cell;
wherein during the second phase of the memory read operation, the first sense amplifier provides current through both the memory cell of the first plurality and the second reference cell and the second sense amplifier provides current through both the memory cell of the second plurality and the first reference cell.

8. The memory of claim 1 wherein the first reference cell includes a transistor biased to provide a first resistance.

9. The memory of claim 1 wherein the memory cells of the first plurality and the memory cells of the second plurality are each characterized as resistive memory cells.

10. A memory comprising:
a first plurality of memory cells;
a second plurality of memory cells;
a first reference cell;
a second reference cell;
a first sense amplifier, the first sense amplifier includes:
  a first current path for providing current through a memory cell during a first phase of a memory read operation and through a reference cell during a second phase of a memory read operation;
  a second current path for providing current through a reference cell during a first phase of a memory read operation and through a memory cell during a second phase of a memory read operation;
  a first capacitor that is coupled to the first current path and coupled through a first switch to the second current path;
  a second capacitor that is coupled to the second current path and coupled through a second switch to the first current path;
a second sense amplifier, the second sense amplifier includes:
  a third current path for providing current through a memory cell during a first phase of a memory read operation and through a reference cell during a second phase of a memory read operation;
  a fourth current path for providing current through a reference cell during a first phase of a memory read operation and through a memory cell during a second phase of a memory read operation;
  a third capacitor that is coupled to the third current path and coupled through a third switch to the fourth current path;
  a fourth capacitor that is coupled to the fourth current path and coupled through a fourth switch to the third current path;
wherein during a first phase of a memory read operation for reading a memory cell of the first plurality of memory cells and a memory cell of the second plurality of memory cells and before a second phase of the memory read operation, one of the first sense amplifier and the second sense amplifier provides current through both the memory cell of the first plurality and the first reference cell and the other of the first sense amplifier and the second sense amplifier provides current through both the memory cell of the second plurality and the second reference cell;
wherein during the second phase of the memory read operation, one of the first sense amplifier and the second sense amplifier provides current through both the memory cell of the first plurality and the second reference cell and the other of the first sense amplifier and the second sense amplifier provides current through both the memory cell of the second plurality and the first reference cell.

11. The memory of claim 10 wherein the first switch, the second switch, the third switch and the fourth switch are closed during the first phase of a memory read operation and open during a second phase of a memory read operation.

12. The memory of claim 10 wherein:
the first current path includes a first transistor for conveying current though the first current path, a control terminal of the first transistor is coupled to the second capacitor;
the second current path includes a second transistor for conveying current though the second current path, a control terminal of the second transistor is coupled to the first capacitor;
the third current path includes a third transistor for conveying current though the third current path, a control terminal of the third transistor is coupled to the fourth capacitor;
the fourth current path includes a fourth transistor for conveying current though the fourth current path, a control terminal of the fourth transistor is coupled to the third capacitor.

13. The memory of claim 10 wherein the first reference cell includes a transistor biased to provide a first resistance.

14. A method of performing a memory read operation comprising:
performing a first phase of a memory read operation for reading a memory cell of a first plurality of memory cells and a memory cell of the second plurality of memory cells, wherein during the first phase, one of a first sense amplifier and a second sense amplifier provides current through both the memory cell of the first plurality and a first reference cell and the other of the first sense amplifier and the second sense amplifier provides current through both the memory cell of the second plurality and a second reference cell, the first reference cell includes a reference resistance that is different than a reference resistance provided by the second reference cell;
performing a second phase of the memory read operation, wherein during the second phase, one of the first sense amplifier and the second sense amplifier provides current through both the memory cell of the first plurality and the second reference cell and the other of the first sense amplifier and the second sense amplifier provides current through both the memory cell of the second plurality and the first reference cell.

15. The method of claim 14 wherein;
the first sense amplifier includes a first current path for providing current through a memory cell during the first phase of the memory read operation and through a reference cell during the second phase of a memory read operation;

the first sense amplifier includes a second current path for providing current through a reference cell during the first phase of a memory read operation and through a memory cell during the second phase of a memory read operation;

the second sense amplifier includes a third current path for providing current through a memory cell during the first phase of a memory read operation and through a reference cell during the second phase of a memory read operation;

the second sense amplifier includes a fourth current path for providing current through a reference cell during the first phase of a memory read operation and through a memory cell during the second phase of a memory read operation.

16. The method of claim 15, wherein:

the first sense amplifier including a first capacitor that is coupled to the first current path and coupled through a first switch to the second current path;

the first sense amplifier including a second capacitor that is coupled to the second current path and coupled through a second switch to the first current path;

the second sense amplifier including a third capacitor that is coupled to the third current path and coupled through a third switch to the fourth current path;

the second sense amplifier including a fourth capacitor that is coupled to the fourth current path and coupled through a fourth switch to the third current path.

17. The method of claim 16 wherein the first switch, the second switch, the third switch and the fourth switch are closed during the first phase of a memory read operation and open during a second phase of a memory read operation.

18. The method of claim 14 wherein the first reference cell has a resistance indicative of a first memory cell value state of the first plurality of memory cells and the second plurality of memory cells and the second reference cell has a resistance that indicative of a second memory cell value state of the first plurality of memory cells and the second plurality of memory cells that is different from the first memory cell value state.

19. The method of claim 14 wherein:

during the first phase of the memory read operation, the first sense amplifier provides current through both the memory cell of the first plurality and the first reference cell and the second sense amplifier provides current through both the memory cell of the second plurality and the second reference cell;

wherein during the second phase of the memory read operation, the first sense amplifier provides current through both the memory cell of the first plurality and the second reference cell and the second sense amplifier provides current through both the memory cell of the second plurality and the first reference cell.

20. The method of claim 14 wherein the memory cells of the first plurality and the memory cells of the second plurality are each characterized as resistive memory cells.

* * * * *